United States Patent
Kim

(10) Patent No.: US 7,061,996 B2
(45) Date of Patent: Jun. 13, 2006

(54) VESTIGIAL SIDEBAND RECEIVER AND METHOD FOR RESTORING CARRIER WAVE

(75) Inventor: Joon Tae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 889 days.

(21) Appl. No.: 09/739,807

(22) Filed: Dec. 20, 2000

(65) Prior Publication Data

US 2001/0006539 A1    Jul. 5, 2001

(30) Foreign Application Priority Data

Dec. 21, 1999  (KR) .............................. 1999-59921

(51) Int. Cl.
*H03D 1/24* (2006.01)
*H04L 27/06* (2006.01)

(52) U.S. Cl. ...................... 375/321; 375/344; 329/357
(58) Field of Classification Search ................ 375/321, 375/344, 340, 326, 277, 270, 319, 376; 329/357

See application file for complete search history.

(56) References Cited

U.S. PATENT DOCUMENTS 5,809,088 A * 9/1998 Han ............................ 375/344
6,748,029 B1 * 6/2004 Lee ............................ 375/326

* cited by examiner

*Primary Examiner*—Khai Tran
(74) *Attorney, Agent, or Firm*—Birch, Stewart, Kolasch & Birch, LLP

(57) ABSTRACT

A vestigial sideband VSB receiver includes a digital processing part for selecting a desired channel frequency via an antenna and converting the desired channel frequency to an intermediate frequency to digitize a predetermined band of the intermediate frequency, a carrier wave restoring part for extracting pilot components from a signal of the digitized pass band to restore carrier waves, and a demodulator for separating components I and Q from the signal of the digitized pass band and multiplying the components with a complex carrier wave, which is restored in the carrier wave restoring part. The carrier waves are restored by extracting the pilot signals from the pass band and detecting the symmetrical errors of the carrier wave frequency, so that the carrier wave may be stably obtained and pursued with relation to the both positive and negative frequency offsets.

17 Claims, 8 Drawing Sheets

−5.38MHz          5.38MHz

44MHz positive offset negative offset (a) component I (b) component Q (c) code value of component I (d) code value of delayed component I (e) code value of delayed phase component I * component Q (a) component I    (b) component Q

VESTIGIAL SIDEBAND RECEIVER AND METHOD FOR RESTORING CARRIER WAVE

BACKGROUND OF THE INVENTION

1. Field of the Invention

The present invention relates to a digital television, and more particularly to, a vestigial sideband receiver for receiving signals which are transmitted by being modulated in a vestigial sideband and a method for restoring carrier waves by receiving the signals.

2. Description of the Related Art

In general, the vestigial sideband (VSB) system of Grand Alliance which is adopted as a standard of a transmission system of digital televisions such as HDTVs in the united states and in Korea, modulates a sideband signal of two sidebands generated upper and lower parts with relation to a carrier wave when amplitude-modulating a signal and the other one sideband signal is largely reduced. That is, a sideband spectrum of a baseband is removed to a pass band to transmit for utilizing a band area effectively.

If a DC spectrum of a base band is removed to a pass band in case of the VSB modulation, the DC spectrum is converted to a tone spectrum, of which a signal is a so-called pilot signal. That is, when a broadcasting bureau performs the VSB modulation, the pilot signal is carried to transmit via air for precisely demodulating the signal in a receiver.

FIG. 1 is a schematic block diagram of a transmission system of a general digital TV, in which a randomizer 101 outputs an input data randomly to a read-Solomon (R-S) encoder 102 for generating a white symbol, the R-S encoder 102 performs R-S coding of the randomly input data for inner and outer channel coding of the signal and adds a parity code of 20 bytes to output to a data interleaver 103.

The data interleaver 103 performs interleaving of the R-S coded data according to some preset regulations to output to a trellis encoder 104, and the trellis encoder 104 converts the interleaved data to a symbol in byte for trellis coding and outputs to a multiplexor 105. The multiplexor 105 performs multiplexing of a segment synchronising signal and a filed synchronising signal to a trellis coded symbol row per segment and frame to form a frame, and outputs the frame to a pilot insertion part 106. The pilot insertion part 106 inserts a pilot signal of a DC value to the framed transmission symbol to output to a VSB modulation part 107. The VSB modulation part 107 modulates the symbol row which is inserted with the pilot signal in the VSB system to output to a RF up-converter 108, and the RF up-converter 108 converts the VSB signal of the converted base band to a RF pass band signal for effectively transmitting the signal via an antenna and transmits the signal via the antenna.

FIGS. 2(a) and 2(b) shows a spectrum of a VSB transmission signal, in which FIG. 2(a) shows a spectrum of a base band which is inserted with the pilot signal, and FIG. 2(b) shows a spectrum of a pass band after change into a transmission signal of the VSB system. As shown in FIG. 2(b), in the spectrum of the pass band, only a sideband spectrum of the base band exists, in which the pilot signal of a sideband exists.

In the meantime, if a digital data is VSB modulated as above and transmitted via air with an antenna from a broadcasting bureau, a domestic digital TV receiver should receive and demodulate the data to watch.

FIG. 3 is a schematic block diagram showing the digital TV receiver, in which a pass band signal of a particular channel is extracted via a tuner, a carrier wave is restored by using a pilot signal inserted in the sideband and a symbol timing is restored and a channel compensation is performed from the restored base band signal to extract a transmission symbol.

That is, if a RF signal which is modulated in the VSB system is received via an antenna, after a tuner 301 selects a desired channel frequency by using a heterodyne modulation system, the VSB signal of the RF band carried on the channel frequency is lowered to a fixed intermediate frequency IF (in general, 44 MHz or 43.75 MHz is widely used) and signals of other channels are properly filtered.

An output signal of the tuner 301 passes through a surface acoustic wave SAW filter 302, which is employed for removing signals of other bands and noise signals and for analogue matching.

As an example, the digital broadcasting signal has all information in a band in the intermediate frequency from 44 MHz to 6 HMz, so that the SAW filter 302 removes all sections except for a band of 6 MHz, in which information from the tuner 301 exists, and outputs the band to a demodulation and FPLL part 303.

The demodulation and FPLL part 303 demodulates signals I and Q of the base band from the output and locks its frequency and phase.

That is, if an output of VCO 313, of which a central frequency is fixed to the intermediate frequency, for example, 46.69 MHz, is input to a second multiplier 309 to be multiplied with an output from the SAW filter 302, a channel signal of Q of the base band is demodulated. Further, if the output from the VCO 313 is input to a first multiplier 304 after delaying its phase by 90 degrees in a phase shifter 308, and multiplied with the output from the SAW filter 302, a channel signal I of the base band is demodulated.

In the meantime, a pilot frequency, which is inserted in a broadcasting bureau, should exist precisely in the intermediate frequency for example 46.69 MHz for normal operation in other receiving parts but usually not in 46.69 MHz. The output frequency of VCO 313 is, however, fixed to 46.69 MHz, and a bite may exist as mush as a frequency difference output from the first and second multipliers 304 and 309 if the pilot output frequency is not 46.69 MHz in the SAW filter 302.

The FPLL is utilized to remove the beat frequency by changing the frequency and phase of the carrier wave by changing an oscillation frequency of the VCO 313. Accordingly, an object of the FPLL is to find out a direction and a size of the movement of the oscillation frequency of the VCO 313, in which an automatic frequency control (AFC) loop filter 306, a limiter 307, a third multiplier 311 and an automatic phase control (APC) loop filter 312 are utilized and called as the FPLL.

Operations of the FPLL will be described as follows.

If a frequency of a signal I of a base band which is low-pass filtered in a low pass filter 305 after being demodulated in the first multiplier 304 is $\omega o$, a pilot output frequency of the SAW filter 302 is $\omega i$, $\cos(\omega i - \omega o)t = \cos \Delta \omega t$, wherein $\Delta \omega = \omega o - \omega i$ (beat frequency).

In the meantime, a signal Q of a base band which is low-pass filtered in a low pass filter 310 after being demodulated in the second multiplier 309, has a shape of $\sin \Delta \omega t$.

At this time, the AFC loop filter 306 is composed with a secondary manual filter capable of locking the beat frequency and outputs phase values with relation to each beat frequency of the signal. An output of the AFC loop filter 306 is input to the limiter 307 to be amplified and limited.

An output from the limiter 307 is multiplied with the signal Q in the third multiplier 311. An output from the multiplier 311 passes through the APC loop filter 312, which limits a band of a signal to 2 KHz to control the VCO 313.

That is, FLL process is performed in case that the beat frequency exists and an output from the limiter 307 varies. When the FLL is finished and the output of the limiter 307 does not vary any more, then PLL process for correcting a phase is carried out.

The signal I which is demodulated to a base band in the demodulation and FPLL part 303, is converted into a digital signal by an A/D converter 314, and output to an I channel processing part 315, wherein the signal Q is utilized for restoring the carrier wave.

The I channel processing part 315 is composed with a synchronising signal abstractor, a channel compensator, an error extractor and the like, wherein the process as shown in the transmission system of FIG. 1 is performed reversely. That is, a data segment synchronising signal, a field synchronising signal and the like, which are inserted in the transmission, are restored from the digitized signal I and a received signal, that is, a transmission symbol is restored by using the synchronising signals.

If there is a frequency offset in the IF signal which is output from the tuner 301, then a spectrum of the received signal is cut away by the SAW filter 302.

The frequency offset in case of a positive direction and a negative direction is as follows.

First, if the frequency offset in the positive direction exists as shown in FIG. 4(a), a right sideband is cut away by the SAW filter and a pilot signal positioned in a left sideband revives it as it is. Therefore, a cut away received signal component may be compensated in an equaliser (not shown) of the I channel processing part 315 in some degree so that no problems may occur in the performance of the system.

In the frequency offset in the negative direction as shown in FIG. 4(b), however, a left sideband is cut away by the SAW filter 302 so that a signal component as well as the pilot component disappear. In this case, the restoring of the carrier wave may not be properly carried out in the demodulation and FPLL part 303. Even though the carrier wave is restored due to a little remaining pilot component, phase jitter is too large in the received signal of the base band, degrading the performance of a receiver largely.

In fact, in case that an analogue FPLL is employed for restoring the carrier wave, as shown in FIG. 3, an acquisition range of the carrier wave is asymmetrical in −110 KHz_+ 200 KHz, which is resulting from the sideband signal component removing of the SAW filter 302.

Such a problem cannot be solved by changing the SAW filter with an element having a wider pass band for removing noise or other channel signals instead of using the SAW filter as a matching filter, or changing the demodulation and carrier wave restoring process into a digital system.

FIG. 5 is a schematic block diagram for showing a structure of a VSB receiver in a digital system. In FIG. 5, as a RF signal, which is modulated in the VSB system, is received via an antenna, a tuner 501 selects a desired channel frequency and a VSB signal of a RF band carried on the channel frequency is lowered to a fixed intermediate frequency band, in which usually 44 MHz or 43.75 MHz is widely used, and is output to an A/D converter 503 via a SAW filter 502. The A/D converter 503 digitizes an output from the SAW filter 502 with the fixed frequency and outputs it to a re-sampling part 504 for conversion into a symbol-restored signal. The re-sampling part 504 is provided with timing errors between the digitized signals and performs interpolation in a direction for reducing the errors. An output from the re-sampling part 504 is output to a digital matching filter 506 which has a fixed coefficient, wherein the SAW filter 502 has no matching function, so that the matching filter 506 is used for producing a maximum SNR at receiving ends. The VSB receiver also includes a timing restoring part 505, a phase divider 507, a multiplier 508, and an NCO 511.

Accordingly, it still has a problem that the pilot signal is cut away in the digital matching filter 506 even though an offset exists and the SAW filter 502 passes the pilot signal as it is.

There are many suggestions to resolve this problem.

First, the coefficient of the matching filter is not to be fixed but to be a variable. That is, information as to whether a current IF signal received from the carrier wave restoring system has how many frequency offsets, is reflected into the variable of the matching filter to transmit the pilot signal to a digital FPLL 510 without losing it. This proposal has, however, disadvantages that the carrier wave restoring system needs a lot of variable multipliers, complicating the hardware, and that the process for obtaining the frequency offset of the current IF signal from the carrier wave restoring system is also complicated. Further, the offset becomes too large in an initial stage, a normal operation cannot be performed if the carrier wave restoring is not achieved.

There is another proposal to put the digital matching filter in the base band. This proposal can smoothly restore the carrier wave since the pilot signal can be transmitted to the base band. However, this proposal still has a problem that a spectrum of a base band of a received signal is suddenly and sharply increased in the vicinity of a DC, resulting in a large loss of the SNR in spite of the compensation of the I channel processing part 509. Accordingly, since it is not proper to have the SNR loss in order to make the carrier wave restoring system solider, this proposal is not preferable.

SUMMARY OF THE INVENTION

An object of the invention is to solve at least the above problems and/or disadvantages and to provide at least the advantages described hereinafter Another object of the present invention is to provide a VSB receiver and a carrier wave restoring method in which a pilot signal is extracted from a pass band for restoring a carrier wave, thereby performing a stable restoring of the carrier wave.

A further object of the present invention is to provide a VSB receiver and a carrier wave restoring method, in which carrier waves may be symmetrically restored without any degradation of performance even though a frequency offset of a VSB signal in a RF or IF band is large in a positive or negative direction.

Still another object of the present invention is to provide a VSB receiver in which carrier waves are restored in a whole digital system and hardware thereof is simplified.

Additional advantages, objects, and features of the invention will be set forth in part in the description which follows and in part will become apparent to those having ordinary skill in the art upon examination of the following or may be learned from practice of the invention. The objects and advantages of the invention may be realised and attained as particularly pointed out in the appended claims.

To achieve the objects and in accordance with the purposes of the invention, as embodied and broadly described herein, a VSB receiver includes a digital processing part for selecting a desired channel frequency via an antenna and converting the desired channel frequency to an intermediate frequency to digitalize a predetermined band of the intermediate frequency, a carrier wave restoring part for extracting pilot components from a signal of the digitalized pass band to restore carrier waves, a demodulator for separating components I and Q from the signal of the digitalized pass band and multiplying the components with a complex carrier wave which is restored in the carrier wave restoring part to demultiplex the components to signals I and Q of a base band, and a symbol restoring part for restoring a transmission symbol from the signal I of the demodulated base band.

The digital processing part includes a surface acoustic wave SAW filter for passing the predetermined band of the middle frequency, a digital converter for digitalizing signals which are passed through the SAW filter, a digital matching filter for passing a band, in which information from the digitalized signals exists, and a phase divider for dividing the components I and Q from the signals which passed through the digital matching filter.

The SAW filter has a pass band, which is designed widely enough to include all VSB signals of the intermediate frequency band.

The carrier wave restoring part includes a pilot extracting part for extracting pilot signals of the components I and Q from the signals of the digitalized pass band, a multiplier for multiplying a complex carrier wave to the extracted pilot signals I and Q to convert them to a base band, a frequency/phase error detecting part for detecting frequency and phase errors from the pilot signals I and Q of the base band, a loop filter for converting the frequency and phase errors to DC components by filtering, and a numerical control oscillator NCO for generating a complex carrier wave proportional to the DC components of the loop filter to output to the multiplier and the demodulator.

The pilot extracting part modulates an IIR low band pass filter of a lower degree to sine waves and cosine waves.

The frequency/phase error detecting part includes a code detector for detecting codes of the pilot signal I which is output from the multiplier, a delay for delaying the detected code components for N sampling, and a multiplier for multiplying an output from the delay with the pilot signal Q, which is output from the multiplier, to output to the loop filter.

An apparatus for restoring carrier waves of a VSB receiver according to the present invention, includes a pilot extracting part for extracting pilot signals of components I and Q from signals of a digitalized pass band, a multiplier for multiplying a complex carrier wave to the extracted pilot signals I and Q to convert them to a base band, a frequency/phase error detecting part for detecting frequency and phase errors from the pilot signals I and Q of the base band, a loop filter for converting the frequency and phase errors to a DC component by filtering, and a numerical control oscillator for generating a complex carrier wave proportional to the DC components of the loop filter to output to the multiplier and the demodulator.

A carrier wave restoring method of a VSB receiver according to the present invention includes the steps of (a) extracting pilot signals of components I and Q from signals of a digitalized pass band, (b) multiplying a complex carrier wave to the extracted pilot signals I and Q to convert them to a base band, (c) detecting frequency and phase errors from the pilot signals I and Q of the base band, (d) converting the frequency and phase errors to a DC component by filtering, and (e) generating a complex carrier wave proportional to the DC components to output to step (b).

In step (a), an IIR low band pass filter of a lower degree is modulated to sine waves and cosine waves to extract the pilot signals of the components I and Q.

According to the present invention, carrier wave restoring may be carried out digitally without losing the symmetry even when an output spectrum of a tuner has a large offset in a random direction from a preset carrier wave frequency.

Additional advantages, objects, and features of the invention will be set forth in part in the description which follows and in part will become apparent to those having ordinary skill in the art upon examination of the following or may be learned from practice of the invention. The objects and advantages of the invention may be realised and attained as particularly pointed out in the appended claims.

BRIEF DESCRIPTION OF THE DRAWINGS

The invention will be described in detail with reference to the following drawings in which like reference numerals refer to like elements wherein:

FIG. 7($b$) is a view showing an example of component Q of the second multiplier;

FIG. 7($c$) is a view showing an example of an output of a code detector of FIG. 6.

FIG. 7($d$) is a view showing an example of an output of a delay of FIG. 6;

FIG. 7($e$) is a view showing an example of an output of a third multiplier of FIG. 6;

FIG. 8($b$) is a view showing an example of component Q which is output from the second multiplier of FIG. 6.

DESCRIPTION OF THE PREFERRED EMBODIMENTS

Now, preferred embodiments of the present invention will be described in detail with reference to the accompanying drawings.

Figure 1:
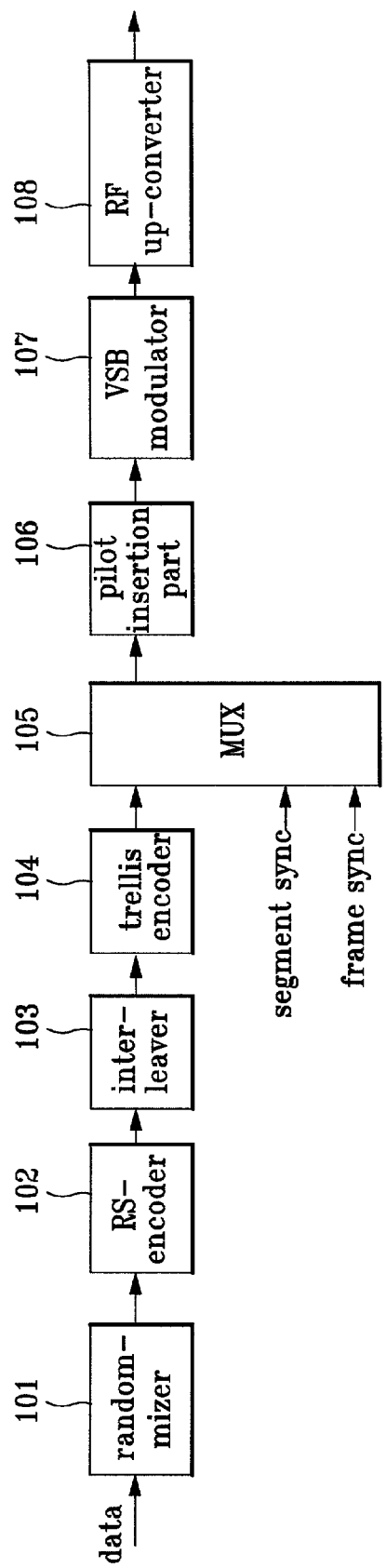
FIG. 1 is a block diagram showing a structure of a related art vestigial sideband transmission device.
Figure 2A:
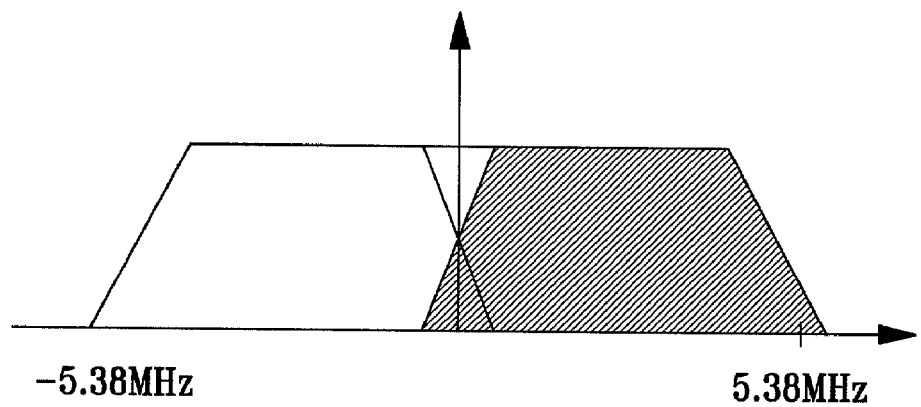
FIG. 2a is a view showing a spectrum of a DC inserted vestigial sideband transmission signal of a base band.
Figure 2B:
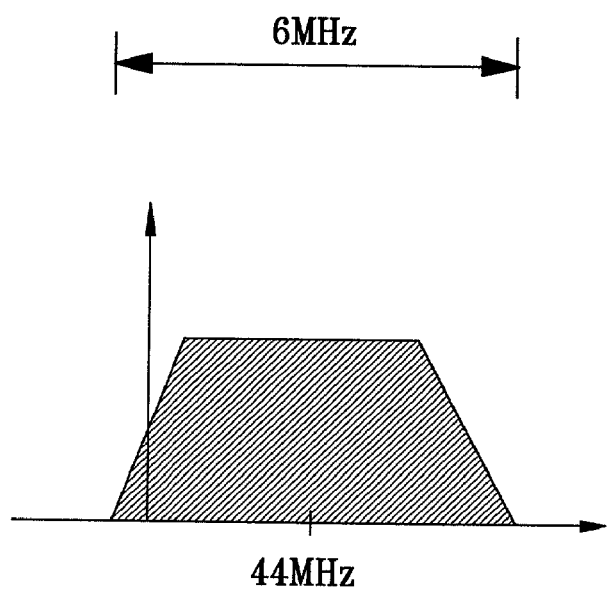
FIG. 2b is a view showing a spectrum of the signal, which is converted to a transmission signal of the vestigial sideband.
Figure 3:
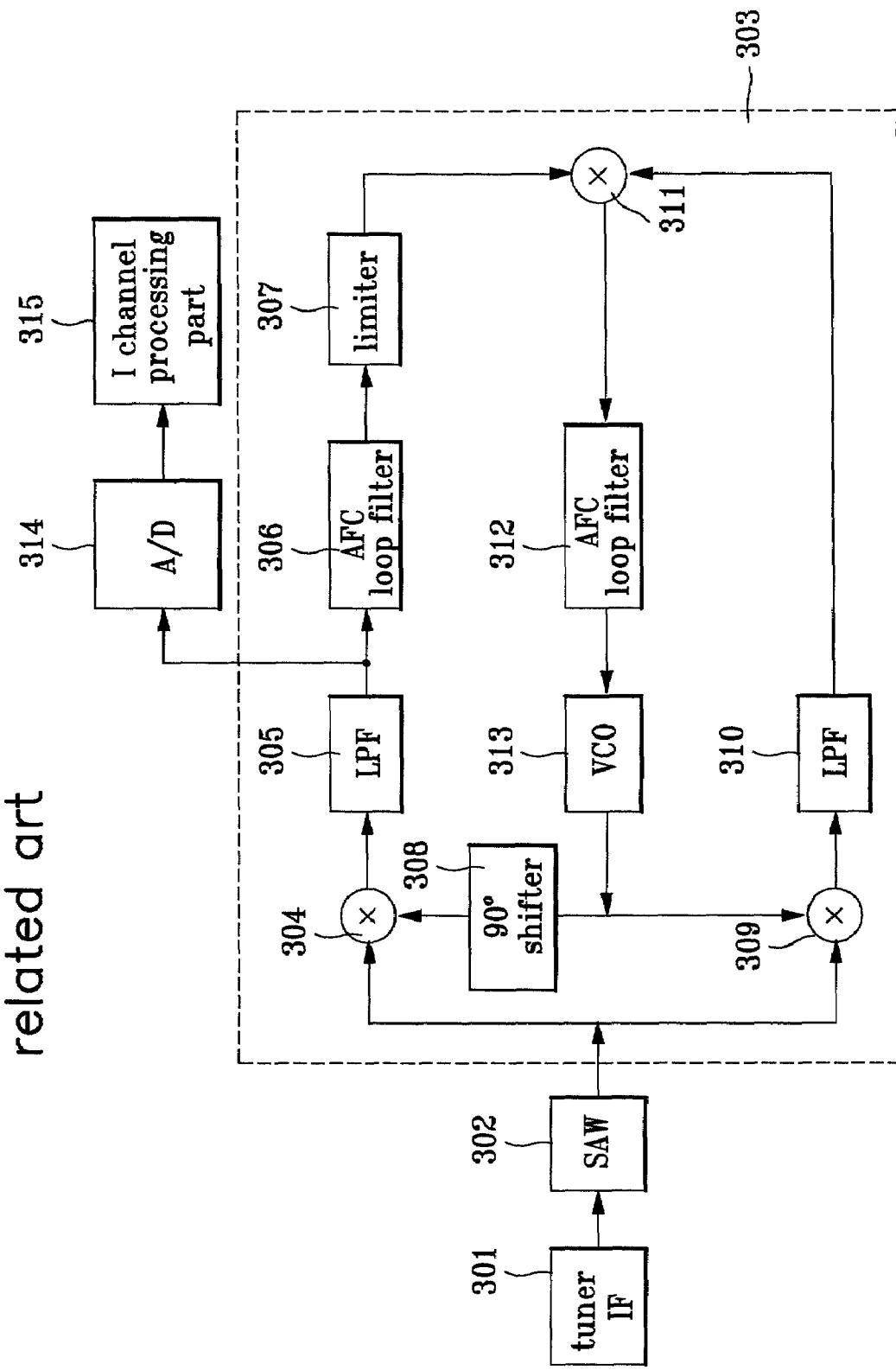
FIG. 3 is a block diagram showing a structure of a related art vestigial sideband receiver with an analogue FPLL.
Figure 4A:
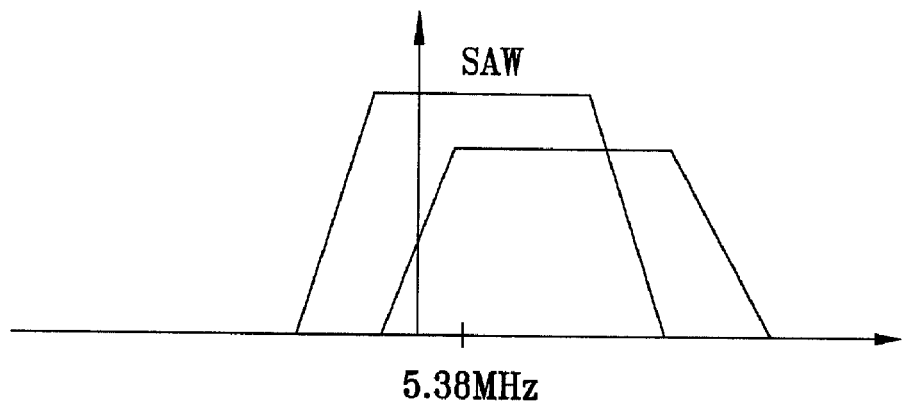
FIG. 4a is a view showing an example of an output of a saw filter in case that a positive frequency offset exists.
Figure 4B:
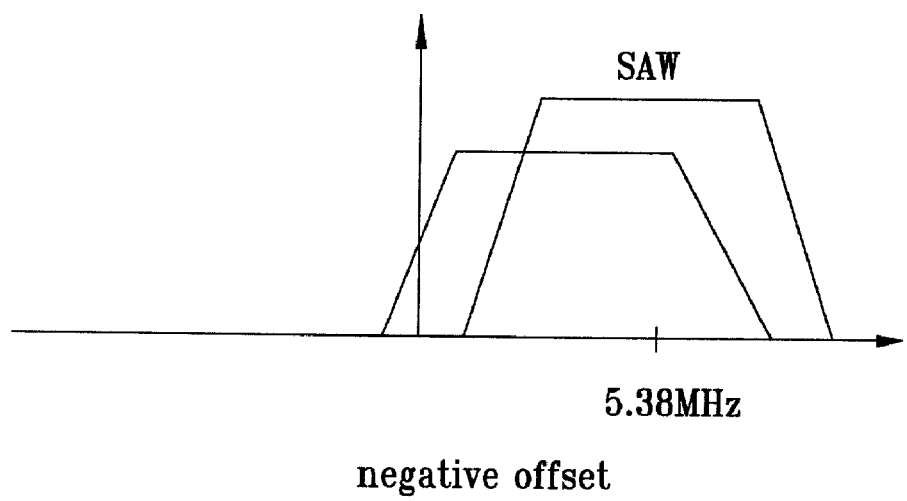
FIG. 4b is a view showing an example of an output of a saw filter in case that a negative frequency offset exists.
Figure 5:
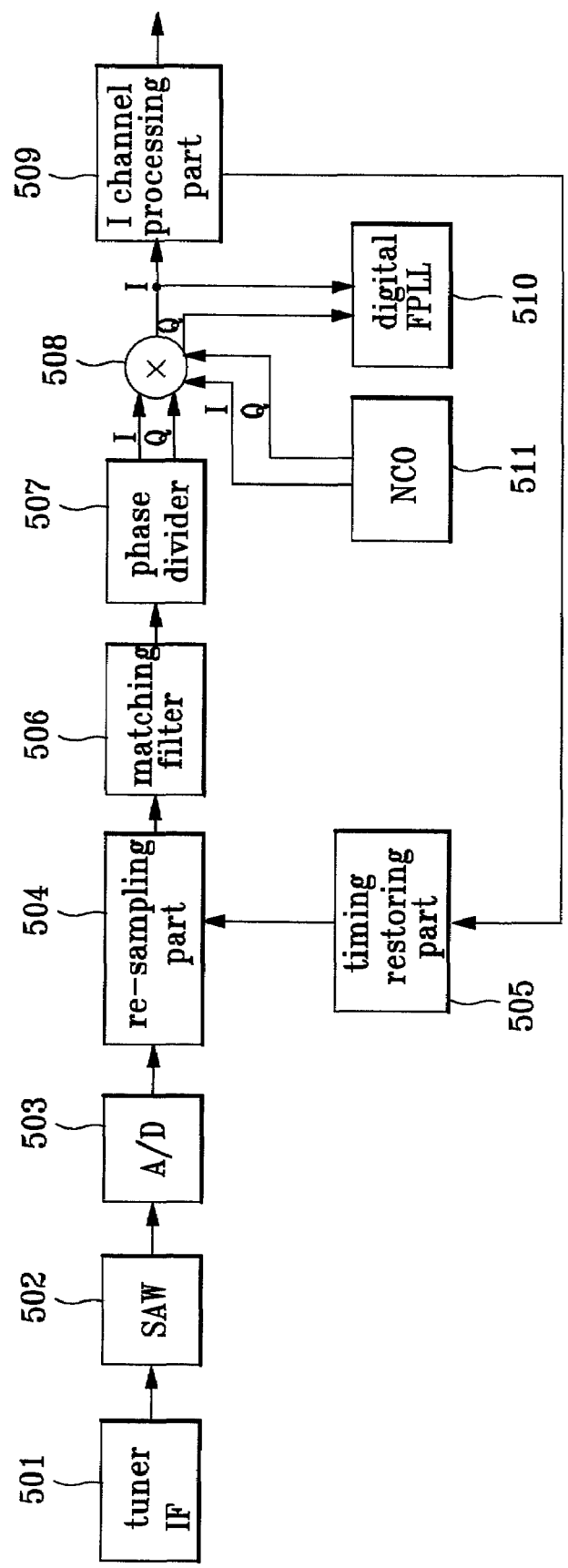
FIG. 5 is a block diagram of a related art vestigial sideband receiver in which a carrier wave is restored digitally.
Figure 6:
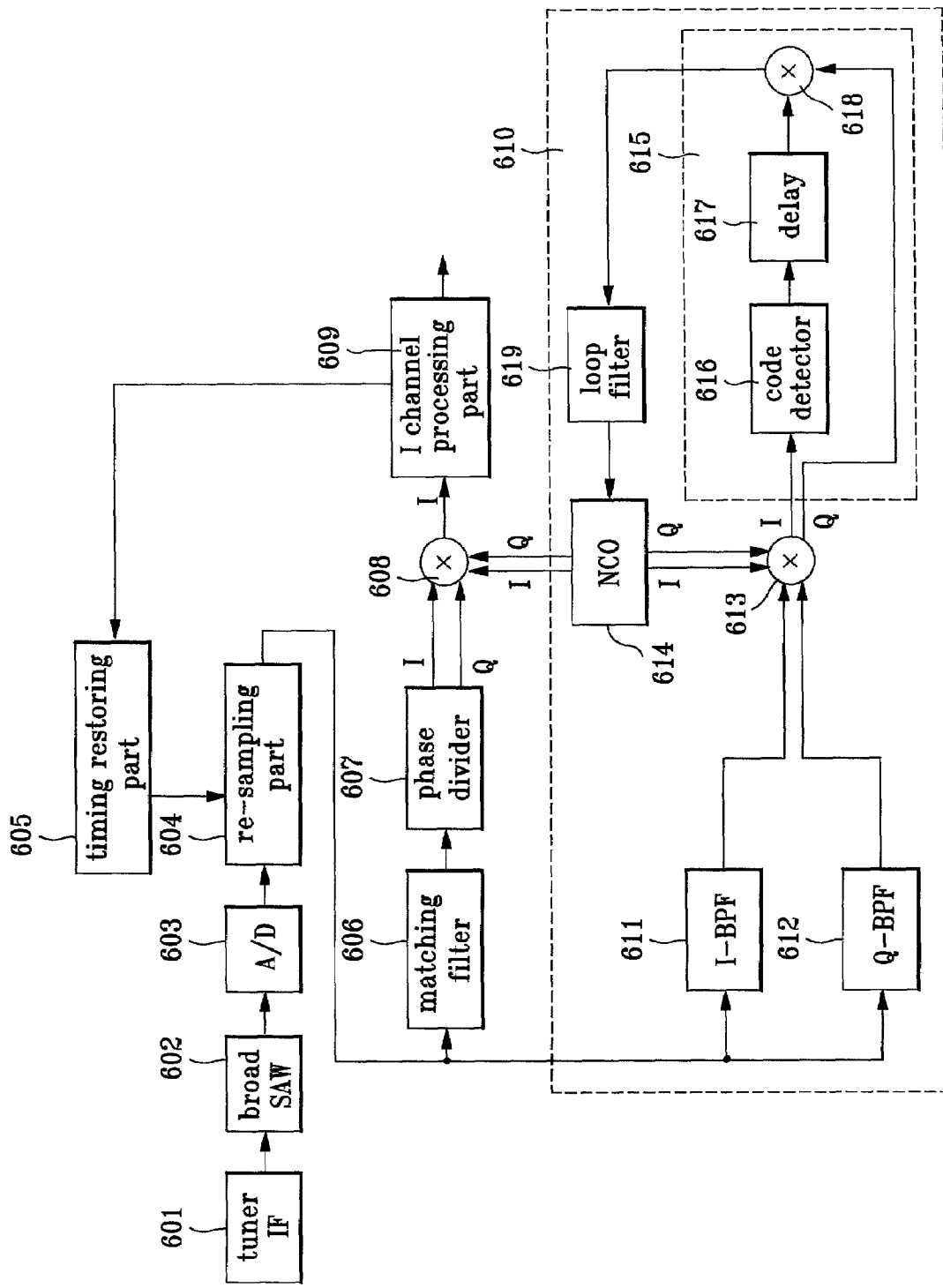
FIG. 6 is a block diagram of a vestigial sideband receiver according to a preferred embodiment of the present invention.

FIG. 6 is a block diagram showing a structure of a vestigial sideband VSB receiver in a whole digital system according to the present invention, which includes a tuner 601 for selecting a desired channel frequency via an antenna and converting a VSB signal of a RF band carried on the channel frequency to an IF band, a surface acoustic wave (SAW) filter 602 for passing a predetermined band of an intermediate frequency output from the tuner 601, an A/D converter 603 for digitizing an output from the SAW filter 602, a re-sampling part 604 for compensating timing errors of current symbols, which are restored via a signal processing of the base band and received from a timing restoring part 605, in a direction for reducing errors between the digitized signals, a carrier wave restoring part 610 for extracting a complex pilot component from an output of the re-sampling part 604 and restoring carrier waves by using the extracted complex pilot components, a digital matching filter 606 for passing a band in which information from the output from the re-sampling part 604, a phase divider 607 for separating components I and Q from the matching filter 606, a first multiplier 608 for multiplying an output from the phase divider 607 with the restored carrier wave to demodulate the output to signals I and Q of the base band, and an I channel processing part 609 for restoring a real data by receiving the demodulated signal I of the base band from the multiplier 608.

The carrier wave restoring part 610 includes I and Q band pass filters 611 and 612 for extracting outputs from the re-sampling part 604, that is, complex pilot components from the pass band, a second multiplier 613 for converting the carrier pilot components from the pass band to the base band, a frequency/phase error detecting part 615 for detecting frequency and phase errors from the pilot signals I and Q of the base band, a loop filter 619 for filtering the detected frequency and phase errors, and a numerical control oscillator (NCO) 614 for generating a complex carrier wave proportional to an output from the loop filter 619 to output to a first multiplier 608 and the second multiplier 613.

The frequency/phase error detecting part 615 includes a code detector 616 for detecting codes of the pilot signal I which is output from the second multiplier 613, a delay 617 for delaying the detected code components for a predetermined time period, and a third multiplier 618 for multiplying an output from the delay 617 with the pilot signal Q to output to the loop filter 619.

In the present invention as described above, as a VSB modulated RF signal is received via an antenna, a desired channel frequency is selected and a VSB signal of the RF band, which is carried on the channel frequency, is lowered to a fixed IF band (IF; in general, 44 MHz or 43.75 MHz is widely used) to properly filter signals of other channels.

From the output from the tuner 601, its residual signals of the other channels and noise components are removed while passing through the SAW filter 602, wherein the pass band of the SAW filter 602 is designed widely enough to include the VSB signals of the IF band. That is, the SAW filter 602 does not carry out any matching functions but removes noise and the other channels' signals, wherein the SAW filter 602 employs an element having a wide pass band.

The IF signals, which are passed through the SAW filter 602, are input to the A/D converter 603, and the A/D converter 603 directly digitizes the IF signals to a fixed frequency to output to the re-sampling part 604. The re-sampling part 604 compensates for timing errors of current symbols, which are restored via a signal processing of the base band and received from the timing restoring part 605, in a direction for reducing errors between the digitized signals, and outputs a sample of 21.52 MHz, which is twice of a symbol ratio of 10.76 MHz.

On the other hand, in the present invention, it is possible to use a structure that an analogue signal, which passed through the SAW filter 602 instead of the A/D converter 603 and the re-sampling part 604, is lowered to a secondary intermediate frequency (2nd IF, in general, 5.38 MHz is employed) by an analogue mixer and a digital data of 21.52 MHz is directly obtained by an A/D converter which uses VCXO as an input clock.

In the present invention, the operation may be carried out regardless of either selection, so that the structure adopting a re-sampler as shown in FIG. 6 will be described as an example.

An IF data, which is sampled to twice of the symbol ratio, becomes a sample having a maximum SNR while passing through the digital matching filter 606. The signals which are passed through the digital matching filter 606 are divided into components I and Q in the phase divider 607 for the complex demodulation and then output to the first multiplier 608. The first multiplier 608 multiplies the signals I and Q of the base band respectively with a complex carrier wave of the NCO 614, which are restored in the carrier wave restoring part 610, in order to demodulate them to the signals I and Q of the base band.

At this time, the signal I of the base band is input to the I channel processing part 609 for the data restoring, and the signal Q of the base band is not used, so that the first multiplier 608 as shown in FIG. 6 may be composed with not a complex multiplier but two multipliers and one adder for extracting real number components. In the meantime, the complex multiplier is composed with four multipliers and two adders for lowering real number components and imaginary number components respectively to the base band.

The I channel processing part 609 restores data by performing a process such as a synchronising signal extraction, a channel compensation, and error correction with relation to the input signal I of the base band.

On the other hand, as described hereinabove, the pilot signals are included in the output signal of the re-sampling part 605 even when the frequency offset exists, since the SAW filter 602 has a wide pass band for including all VSB transmission signal band widths. Accordingly, the pilot signal may be directly extracted from the pass band by using the complex band pass filters 611 and 612 of the carrier wave restoring part 610.

The I and Q band pass filters 611 and 612 may be realized by coefficients which modulate a finite impulse response (FIR) low pass filter with a sine wave and a cosine wave, which requires a lot of hardware for realizing the band pass filter. Therefore, it is simple in view of the hardware to modulate an infinite impulse response (IIR) low pass filter of a simple degree with the sine wave and the cosine wave, in which the pilot signal may be precisely extracted with a smaller degree. A realization of a simple primary low pass filter will be described with reference to examples of All-pole IIR filter and Butterworth IIR filter in detail hereinafter.

The complex pilot signals, which are extracted from the pass band via the I and Q band pass filters 611 and 612, are input to the second multiplier 613 and lowered to the base band by being multiplied with the complex carrier wave of the NCO 614, which is used for the lowering of the VSB signals of the pass band to the base band. If it is assumed that the pilot signal is P, an In-phase component I thereof is Pr, and a Quadrature-phase component Q thereof is $P_i$, then $P=P_r+jP_i$.

If the frequency and phase offset is 0, and the noise and VSB signal components introduced together are ignored, the signal Pr is represented by a DC signal (for example, cos 0°=1), and the signal Pi is represented by 0 (for example, sin 0°=0). Therefore, if the pilot signal component I of the base band, which is represented by DC, is passed through the code detector 616 and the delay 617, and multiplied with the pilot signal component Q of the base band by the third multiplier 618, the output from the third multiplier 618 becomes 0, which has no effect on the loop filter 619.

Figure 7:
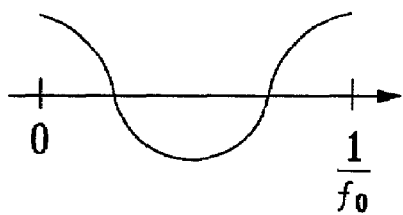
FIGS. 7($a$)–7($e$) are views showing operations of a digital frequency/phase error detector in case that a frequency error exists, wherein FIG. 7($a$) is a view showing an example of component I which is output from a second multiplier.
Figure 7:
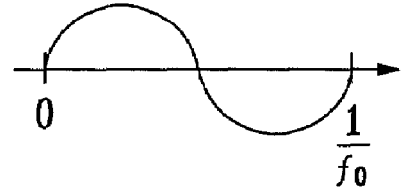
Figure 7:
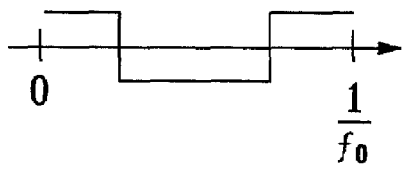
Figure 7:
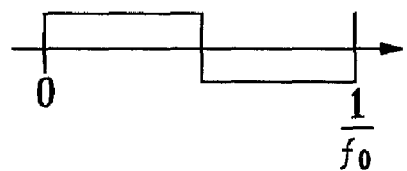
Figure 7:
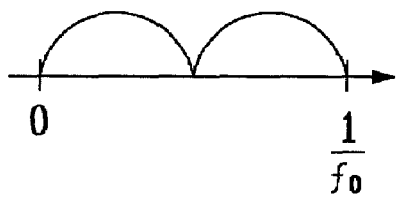

On the other hand, if the frequency offset is $f_0$, then, the signals $P_r$ and $P_i$ are represented by following formula 1.

$$p_r = \cos\left(\frac{2\pi f_0}{f_s}n\right)$$
$$p_r = \sin\left(\frac{2\pi f_0}{f_s}n\right)$$
[formula 1]

wherein, $f_s$ is a sampling frequency, which is twice of the symbol ratio, that is, 21.52 MHz. Therefore, the signals $P_r$ and $P_i$ are shown by the sine wave and the cosine wave respectively having a period of $1/f_0$ as shown in FIG. 7(*a*) and FIG. 7(*b*). The component I of FIG. 7(*a*) is input to the code detector 616 of the frequency/phase error detector 615 for using the code values only, as shown in FIG. 7(*c*). The code values, which are output from the code detector 616, are delayed for N sampling as shown in FIG. 7(*d*) and output to the third multiplier 618.

If the signal, which is delayed by N sampling in the third multiplier 618, is multiplied with the cosine wave of the component Q as shown in FIG. 7(*b*), a DC component which is proportional to a frequency error exists as shown in FIG. 7(*e*). That is, the frequency/phase error detector 615 carries out the frequency error detection. While an output from the frequency/phase error detector 615 passes through the loop filter 619, the DC component is extracted and input to the NCO 614. The NCO 614 raises or lowers a current operation frequency according to the DC component and outputs to the first and second multipliers 608 and 613.

The value N that determines how many samples to be delayed in the delay 617 is an important parameter for determining a pull in range of the frequency error detector. For example, if the value N is small, the error is generated over a wide range frequency, while the DC value of the error becomes decreased, decreasing a gain of the detector. To the contrary, if the value N is large, the operation range is small while the DC value of the error becomes increased, increasing the gain of the detector, thereby reducing the phase noise and making it possible to restore the carrier waves.

Therefore, the value N should be selected carefully. In general, in order to obtain carrier waves of −200 KHz~+200 KHz, N=50~75.

If the frequency offset becomes 0 while repeating the above procedure, the signal $P_r$ of the pilot signal component I of the base band is represented by DC.

Figure 8:
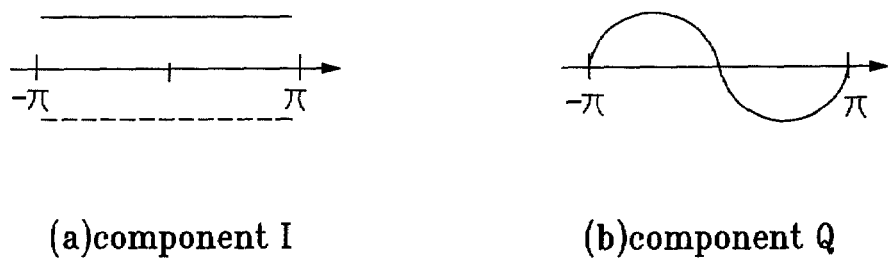
FIGS. 8($a$)–8($b$) are views showing operations of the digital frequency/phase error detector in case that a phase error exists, wherein FIG. 8($a$) is a view showing an example of component I which is output from the second multiplier of FIG. 6.

If it is assumed that the frequency offset is 0 and a phase error exists, that is, the signal Pr is DC as shown in FIG. 8(*a*) and the signal Pi is a cosine wave which is not 0 as shown in FIG. 8(*b*), the signal Q and the code values of the DC, that is, I or −I are multiplied through all time periods in the third multiplier 618. It may be seemed to have no frequency locked-loop FLL.

Therefore, the third multiplier 618 outputs only a phase error value of the cosine wave with relation to the phase error to the loop filter 619 and the loop filter 619 extracts the DC component to output to the NCO 614. The NCO 614 amends the phase error by raising or lowering the current operation frequency and outputs to the first and second multipliers 608 and 613.

Consequently, in the frequency/phase error detector 615, the FLL initiatively operates for making the frequency error 0 and then the PLL initiatively operates for amending the phase as the frequency is restored.

Now, the complex band pass filters 611 and 612 that extract the pilot signals from the pass band will be described in more detail. The complex band pass filters 611 and 612 modulate the IIR low pass filter of a lower degree to the sine and cosine waves as described above in order to obtain the complex pilot signals.

As an example of the IIR low pass filter of a lower degree, a primary All Pole low pass filter may be used. For example, Z-conversion of the primary All Pole low pass filter is referred to H(z), H(z) may be represented by formula 2.

$$H(z) = s \cdot \frac{1}{1 - az^{-1}}$$
[formula 2]

wherein, s is a normalisation constant for making a DC gain 1, and a is a value for determining a 3-dB band area, which may be 0~1.

If the sine and cosine modulation signals of H(z) of formula 2 are respectively referred to $H_r(z)$ and $H_i(z)$, $H_r(z)$ and $H_i(z)$ may be represented by formula 3.

$$H_r(z) = s \cdot \frac{1 - a \cdot \cos\omega_c z^{-1}}{1 - a \cdot \cos\omega_c z^{-1} + z^{-2}}$$
$$H_i(z) = s \cdot \frac{1 - a \cdot \sin\omega_c z^{-1}}{1 - a \cdot \sin\omega_c z^{-1} + z^{-2}}$$
[formula 3]

wherein, $\omega_c$ is a normalised carrier wave frequency, which is represented by formula 4.

$$\omega_c = 2\pi \frac{f_c}{f_s}$$
[formula 4]

is an analog carrier wave frequency and $f_s$ is a sampling frequency)

Figure 9:
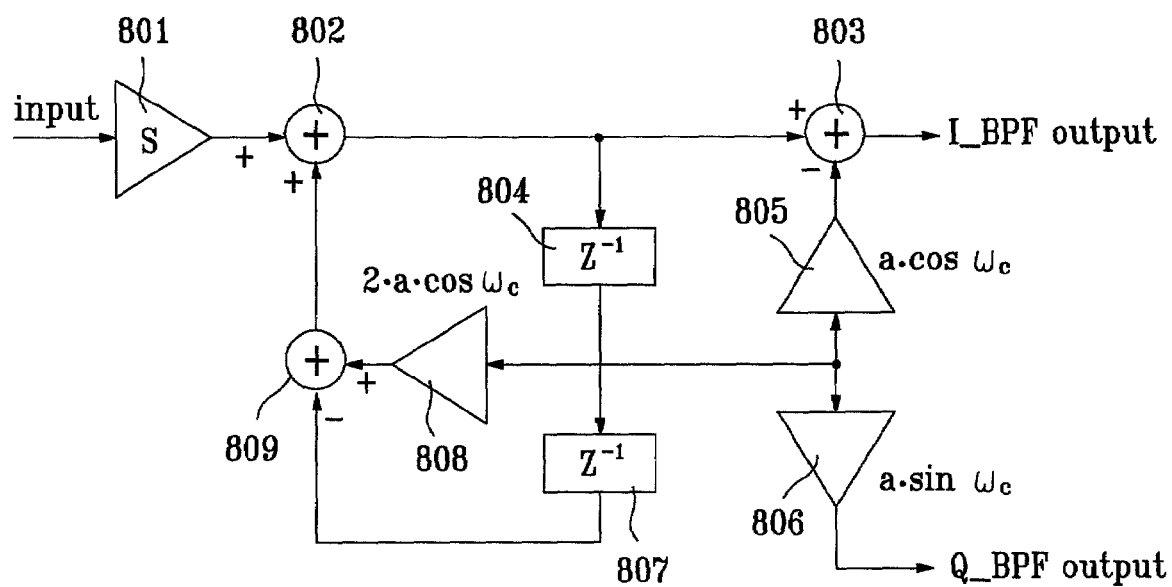
FIG. 9 is a block diagram showing an example of a complex carrier wave band pass filter of FIG. 6.

In $H_r(z)$ and $H_i(z)$ of formula 3, the denominators are equal to each other and numerators are different from each other. Therefore, the complex band pass filters 611 and 612 use a transposed IIR structure and shares a common denominator as shown in a structure of FIG. 9. In FIG. 9, by sharing a common denominator, formula 3 is realized in hardware as it is, wherein a multiplier 801, an adder 802, delays 804 and 805, a multiplier 808 and a substracter 809 correspond to the denominator of formula 3.

On the other hand, as another example of the complex band pass filters 611 and 612, a low pass filter of a primary Butterworth may be utilized, wherein if it is assumed that z conversion of the low pass filter of the primary Butterworth is B(z), B(z) may be represented by following formula 5.

$$B(z) = s \cdot \frac{1-z^{-1}}{1-az^{-1}} \quad [\text{formula 5}]$$

wherein, s and a have the same meaning as in the above formula 3.

If the sine and cosine modulation signals of B(z) are $B_r(z)$ and $B_i(z)$, $B_r(z)$ and $B_i(z)$ are represented by following formula 6.

$$B_r(z) = s \cdot \frac{1 - a \cdot \cos\omega_c z^{-1}}{1 - a \cdot \cos\omega_c z^{-1} + z^{-2}}$$

$$B_i(z) = s \cdot \frac{1 - a \cdot \sin\omega_c z^{-1}}{1 - a \cdot \cos\omega_c z^{-1} + z^{-2}}$$

wherein, $\omega_c$ is a normalised carrier wave frequency and represented by formula 7.

$$\omega_c = 2\pi \frac{f_c}{f_s} \quad [\text{formula 7}]$$

Similarly, $B_r(z)$ and $B_i(z)$ have the same denominator so that the complex band pass filters 611 and 612 having the similar structure with FIG. 9 may be realized, in which a common denominator is shared by $B_r(z)$ and $B_i(z)$ and the numerators are different from each other.

As described hereinabove, according to the VSB receiver and the carrier wave restoring method of the present invention, the extraction of the pilot signals from the pass band and the restoring of the carrier waves are performed digitally, so that it is not necessary to attach an analogue element such as the VCO to an outside additionally. Further, the frequency/phase error detector detects symmetrical errors with relation to the carrier wave frequency offset, so that carrier waves may be stably obtained and pursued even with relation to the both positive and negative frequency offsets.

Furthermore, even though a complex multiplier is added and the complex low filter, which was necessary to extract the pilot signals from the base band, is removed to the pass band filter, the present invention requires no more hardware differently from the previous manner in which complicated hardware should be added. Owing to the added complex multiplier, the complex multipliers, that are four real number multipliers and two adders which are required in the related art for lowering the VSB signals of the pass band to the base band, may be simplified to two multipliers for extracting real number components and one adder. Therefore, if the complex pass band filter is realized, there is an effect of reducing the hardware, since the multipliers and the adders may be saved in comparison with the case to realize them separately.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

The invention claimed is:

1. A vestigial sideband (VSB) receiver for receiving signals which are transmitted by being modulated in a vestigial sideband method, comprising:
    a digital processing part for selecting a desired channel frequency and converting the desired channel frequency to an intermediate frequency to digitize a predetermined pass band of the intermediate frequency;
    a carrier wave restoring part for extracting pilot components from a signal of the digitized pass band to restore carrier waves;
    a demodulator for separating components I and Q from the signal of the digitized pass band and multiplying the I and Q components with a complex carrier wave restored in the carrier wave restoring part, to demultiplex the components I and Q to signals I and Q of a base band; and
    a symbol restoring part for restoring a transmission symbol from the signal I of the demodulated base band output from the demodulator, wherein the digital processing part comprises:
        a surface acoustic wave (SAW) filter for passing a predetermined band of the intermediate frequency,
        a digital converter for digitizing signals which are passed through the SAW filter,
        a digital matching filter for passing a band in which information from the digitized signals exists, and
        a phase divider for dividing the components I and Q from the signals which passed through the digital matching filter.

2. The vestigial sideband receiver of claim 1, wherein the SAW filter has a pass band designed widely enough to include all vestigial sideband signals of middle frequency band.

3. The vestigial sideband receiver of claim 1, wherein the digital converter comprises:
    an A/D converter for directly converting an analog IF signal which passed through the SAW filter to a digital signal by using a fixed frequency as an input clock,
    and a re-sampling part for reducing errors between the signals which are digitized in the A/D converter by using a timing error of current symbols which are restored by the symbol restoring part.

4. The vestigial sideband receiver of claim 1, wherein the digital converter comprises:
    an analog mixer for converting the analog IF signal which passed through the SAW filter to a secondary analog IF signal, and
    an A/D converter for directly digitizing the secondary analog IF signal by using VCXO as an input clock.

5. The VSB receiver of claim 1, wherein the carrier wave restoring part generates the complex carrier wave proportional to frequency and phase errors associated with pilot signals of the base band.

6. A vestigial sideband (VSB) receiver comprising:
    a digital processing part for selecting a desired channel frequency and converting the desired channel frequency to an intermediate frequency to digitize a predetermined pass band of the intermediate frequency;
    a carrier wave restoring part for extracting pilot components from a signal of the digitized pass band to restore carrier waves;
    a demodulator for separating components I and Q from the signal of the digitized pass band and multiplying the I and Q components with a complex carrier wave restored in the carrier wave storing part, to demultiplex the components I and Q to signals I and Q of a base band; and a symbol restoring part for restoring a transmission symbol from the signal I of the demodulated base band output from the demodulator, wherein the carrier wave restoring part comprises:

a pilot extracting part for extracting pilot signals of the components I and Q from the signals of the digitizing pass band, the pilot extracting part modulating an IIR low band pass filter of a lower degree to sine waves and cosine waves, a multiplier for multiplying a complex carrier wave to the extracted pilot signals I and Q to convert to the base band, a frequency/phase error detecting part for detecting frequency and phase errors from the pilot signals I and Q of the base band, a loop filter for converting the frequency and phase errors to DC components by filtering, and a numerical control oscillator for generating a complex carrier wave proportional to the DC components of the loop filter to output to the multiplier and the demodulator.

7. The vestigial sideband receiver of claim 6, wherein the IIR low band pass filter is a primary All pole IIR filter to which following formula is applied:

$$H_r(z) = s \cdot \frac{1 - a \cdot \cos\omega_c z^{-1}}{1 - a \cdot \cos\omega_c z^{-1} + z^{-2}}$$

$$H_i(z) = s \cdot \frac{1 - a \cdot \sin\omega_c z^{-1}}{1 - a \cdot \cos\omega_c z^{-1} + z^{-2}}$$

wherein, if it is assumed that Z conversion of the primary All Pole low band pass filter is H(z), Hr(z) and Hi(z) are respectively a sine wave modulation signal and a cosine wave modulation signal of H(z), ωc is a normalised carrier wave frequency, s is a normalisation constant for making a DC gain to be 1, and a is a value for determining a 3-dB band area.

8. The vestigial sideband receiver of claim 7, wherein the primary All-pole IIR filter shares a common denominator when designing a filter for extracting pilot components of the component I and a filter for extracting pilot components of the component Q.

9. The vestigial sideband receiver of claim 6, wherein the IIR low band pass filter is a primary Butterworth IIR filter to which following formula is applied:

$$B_r(z) = s \cdot \frac{1 - a \cdot \cos\omega_c z^{-1}}{1 - a \cdot \cos\omega_c z^{-1} + z^{-2}}$$

$$B_i(z) = s \cdot \frac{1 - a \cdot \sin\omega_c z^{-1}}{1 - a \cdot \cos\omega_c z^{-1} + z^{-2}}$$

wherein, if it is assumed that Z conversion of the primary Butterworth IIR filter is B(z), Br(z) and Bi(z) are respectively a sine wave modulation signal and a cosine wave modulation signal of B(z), ωc is a normalised carrier wave frequency, s is a normalisation constant for making a DC gain to be 1, a is a value for determining a 3-dB band area.

10. The vestigial sideband receiver of claim 9, wherein the primary Butterworth IIR filter shares a common denominator when designing a filter for extracting pilot components of the component I and a filter for extracting pilot components of the component Q.

11. The vestigial sideband receiver of claim 6, wherein the frequency/phase error detecting part comprises:

a code detector for detecting codes of pilot signal I which is output from the multiplier, a delay for delaying the detected code components for N sampling, and a multiplier for multiplying an output from the delay with pilot signal Q which is output from the multiplier to output to the loop filter.

12. An apparatus for restoring carrier waves of a vestigial sideband receiver for restoring carrier waves by receiving signals which are transmitted by being modulated in a vestigial sideband method and converting the signals to digital signals of a pass band, the apparatus comprising:

a pilot extracting part for extracting pilot signals of components I and Q from signals of the digitized pass band, the pilot extracting part modulating an IIR low band pass filter of a lower degree to sine waves and cosine waves;

a first multiplier for multiplying a complex carrier wave to the extracted pilot signals I and Q to convert them to a base band;

a frequency/phase error detecting part for detecting frequency and phase errors from the pilot signals of the base band;

a loop filter for converting the frequency and phase errors to DC components by filtering;

and a numerical control oscillator for generating a complex carrier wave proportional to the DC components of the loop filter to output to the multiplier and a demodulator.

13. The carrier wave restoring apparatus of claim 12, wherein the IIR low band pass filter is a primary All pole IIR filter to which following formula is applied:

$$H_r(z) = s \cdot \frac{1 - a \cdot \cos\omega_c z^{-1}}{1 - a \cdot \cos\omega_c z^{-1} + z^{-2}}$$

$$H_i(z) = s \cdot \frac{1 - a \cdot \sin\omega_c z^{-1}}{1 - a \cdot \cos\omega_c z^{-1} + z^{-2}}$$

wherein, if it is assumed that Z conversion of the primary All Pole low band pass filter is H(z), Hr(z) and Hi(z) are respectively a sine wave modulation signal and a cosine wave modulation signal of H(z), ωc is a normalised carrier wave frequency, s is a normalisation constant for making a DC gain to be 1, and a is a value for determining a 3-dB band area.

14. The carrier wave restoring apparatus of claim 12, wherein the IIR low band pass filter is a primary Butterworth IIR filter to which following formula is applied:

$$B_r(z) = s \cdot \frac{1 - a \cdot \cos\omega_c z^{-1}}{1 - a \cdot \cos\omega_c z^{-1} + z^{-2}}$$

$$B_i(z) = s \cdot \frac{1 - a \cdot \sin\omega_c z^{-1}}{1 - a \cdot \cos\omega_c z^{-1} + z^{-2}}$$

wherein, if it is assumed that Z conversion of the primary Butterworth IIR filter is B(z), Br(z) and Bi(z) are respectively a sine wave modulation signal and a cosine wave modulation signal of B(z), ωc is a normalised carrier wave frequency, s is a normalisation constant for making a DC gain to be 1, a is a valuefor determining a 3-dB band area.

15. The carrier wave restoring apparatus of claim 12, wherein the frequency/phase error detecting part comprises:
   a code detector for detecting codes of pilot signal I which is output from the multiplier,
   a delay for delaying the detected code components for N sampling, and
   a second multiplier for multiplying an output from the delay with pilot signal Q which is output from the first multiplier to output to the loop filter.

16. A carrier wave restoring method for a vestigial sideband receiver which receives signals transmitted by being modulated in a vestigial sideband method, and converts the signals to digital signals of a pass band to restore carrier waves, the method comprising the steps of:
   (a) extracting pilot signals of components I and Q from signals of the digitized pass band;
   (b) multiplying a complex carrier wave to the extracted pilot signals I and Q to convert them to a base band;
   (c) detecting frequency and phase errors from the pilot signals of the base band;
   (d) converting the frequency and phase errors to DC components by filtering; and
   (e) generating a complex carrier wave proportional to the DC components to output to the step (b), wherein in the step (a), an IIR low band pass filter of a lower degree is modulated to sine waves and cosine waves to extract the pilot signals of the components I and Q.

17. The carrier wave restoring method of claim 16, wherein the step (c) includes the sub-steps of:
   detecting codes of pilot signal I which is output from the step (b),
   delaying the detected code components for N sampling, and
   multiplying an output from the delay step with pilot signal Q which is output from the step (b), to output to the step (d).

* * * * *